United States Patent
Bindig et al.

(10) Patent No.: US 9,598,319 B2
(45) Date of Patent: Mar. 21, 2017

(54) PIEZOCERAMIC MULTI-LAYER ELEMENT

(75) Inventors: Reiner Bindig, Bindiach (DE); Hans-Jurgen Schreiner, Neunkirchen am Sand-rollhofen (DE)

(73) Assignee: CeramTec GmbH, Plochingen (DE)

( * ) Notice: Subject to any disclaimer, the term of this patent is extended or adjusted under 35 U.S.C. 154(b) by 251 days.

(21) Appl. No.: 12/682,883

(22) PCT Filed: Oct. 20, 2008

(86) PCT No.: PCT/EP2008/064123
§ 371 (c)(1), (2), (4) Date: Aug. 18, 2010

(87) PCT Pub. No.: WO2009/050299
PCT Pub. Date: Apr. 23, 2009

(65) Prior Publication Data
US 2010/0307669 A1  Dec. 9, 2010

(30) Foreign Application Priority Data
Oct. 18, 2007 (DE) .................... 10 2007 000 523

(51) Int. Cl.
*C03B 29/00* (2006.01)
*B32B 27/00* (2006.01)
(Continued)

(52) U.S. Cl.
CPC .......... *C04B 35/491* (2013.01); *C04B 35/462* (2013.01); *C04B 35/468* (2013.01);
(Continued)

(58) Field of Classification Search
CPC .......... C04B 35/491; C04B 2235/3201; C04B 2235/3213; C04B 2235/3251;
(Continued)

(56) References Cited

U.S. PATENT DOCUMENTS 3,194,765 A * 7/1965 Bratschun .............. 252/62.9 PZ
5,792,379 A * 8/1998 Dai et al. .............. 252/62.9 PZ
(Continued)

FOREIGN PATENT DOCUMENTS

DE          198 40 488       3/1999
DE       10 2004 031307      1/2006
(Continued)

OTHER PUBLICATIONS

Fukui et al. "JP 2001-206769, machine translation", published Jul. 31, 2001.*
(Continued)

*Primary Examiner* — Alex Efta
(74) *Attorney, Agent, or Firm* — Norton Rose Fulbright US LLP

(57) ABSTRACT

According to the state of the art, piezoceramic multi-layer elements are sintered in air at temperatures of approximately 1100 DEG C or higher. Therefore, only a noble metal having a high melting temperature can be used as the inner electrode. Non-noble metals would oxidize. Therefore, a silver-palladium alloy having up to 40% palladium is normally used. However, such a measure is associated with high material costs. Lower melting temperatures of the inner electrode material, however, also require a ceramic material having correspondingly low sintering temperatures. The invention therefore proposes that an electrically non-conductive sintering additive added be added to the base material, and that the inner electrode comprise silver, preferably pure silver, as the main material component thereof, and an electrically non-conductive material component and/or a metal alloy or metal oxide mixture.

16 Claims, 1 Drawing Sheet

(51) Int. Cl.
| | |
|---|---|
| *C04B 35/00* | (2006.01) |
| *C04B 35/491* | (2006.01) |
| *C04B 37/00* | (2006.01) |
| *C04B 35/462* | (2006.01) |
| *C04B 35/468* | (2006.01) |
| *C04B 35/63* | (2006.01) |
| *C04B 35/475* | (2006.01) |
| *H01L 41/187* | (2006.01) |
| *H01L 41/273* | (2013.01) |
| *H01L 41/43* | (2013.01) |
| *H01L 41/047* | (2006.01) |
| *C04B 35/622* | (2006.01) |

(52) U.S. Cl.
CPC ........ *C04B 35/475* (2013.01); *C04B 35/6303* (2013.01); *C04B 37/001* (2013.01); *C04B 37/006* (2013.01); *H01L 41/0471* (2013.01); *H01L 41/0477* (2013.01); *H01L 41/1876* (2013.01); *H01L 41/273* (2013.01); *H01L 41/43* (2013.01); *C04B 35/622* (2013.01); C04B 2235/3201 (2013.01); C04B 2235/3213 (2013.01); C04B 2235/3251 (2013.01); C04B 2235/3255 (2013.01); C04B 2235/3272 (2013.01); C04B 2235/447 (2013.01); C04B 2235/5445 (2013.01); C04B 2235/6025 (2013.01); C04B 2235/72 (2013.01); C04B 2235/727 (2013.01); C04B 2235/768 (2013.01)

(58) Field of Classification Search
CPC .... C04B 2235/3255; C04B 2235/3272; C04B 2235/5445; C04B 2235/447; C04B 2235/6025; C04B 2235/72; C04B 2235/727; C04B 2235/768; C04B 35/46; C04B 35/462; C04B 35/468; C04B 35/475; C04B 35/622; C04B 35/6303; C04B 37/001; C04B 37/006; H01L 41/0471; H01L 41/0477; H01L 41/1876; H01L 41/273; H01L 41/41
USPC .............................................. 156/89.11, 242
See application file for complete search history.

(56) References Cited

U.S. PATENT DOCUMENTS

| | | | |
|---|---|---|---|
| 6,511,763 B1* | 1/2003 | Katsube et al. | ............ 428/699 |
| 6,692,651 B2 | 2/2004 | Helke | |
| 6,700,311 B2 | 3/2004 | Hammer et al. | |
| 6,808,649 B1 | 10/2004 | Kim | |
| 2002/0149297 A1* | 10/2002 | Yamamoto | ............ H01L 41/083 |
| | | | 310/328 |
| 2004/0012000 A1 | 1/2004 | Ponomarev et al. | |
| 2004/0058797 A1* | 3/2004 | Nonoyama et al. | .......... 501/134 |
| 2004/0071864 A1* | 4/2004 | Yao et al. | ..................... 427/100 |
| 2004/0087432 A1* | 5/2004 | Sasaki | .................. C04B 35/493 |
| | | | 501/134 |
| 2004/0129919 A1* | 7/2004 | Horikawa | ............. C04B 35/493 |
| | | | 252/62.9 PZ |
| 2006/0202152 A1* | 9/2006 | Iezumi | ................. C04B 35/493 |
| | | | 252/62.9 PZ |

FOREIGN PATENT DOCUMENTS

| | | |
|---|---|---|
| DE | 10 2004 031307 A1 | 1/2006 |
| EP | 1 124 265 | 8/2001 |
| EP | 1 124 265 A2 | 8/2001 |
| JP | 2001206769 A * | 7/2001 |

OTHER PUBLICATIONS

PCT International Search Report in corresponding international application PCT/EP2008/064123.

* cited by examiner

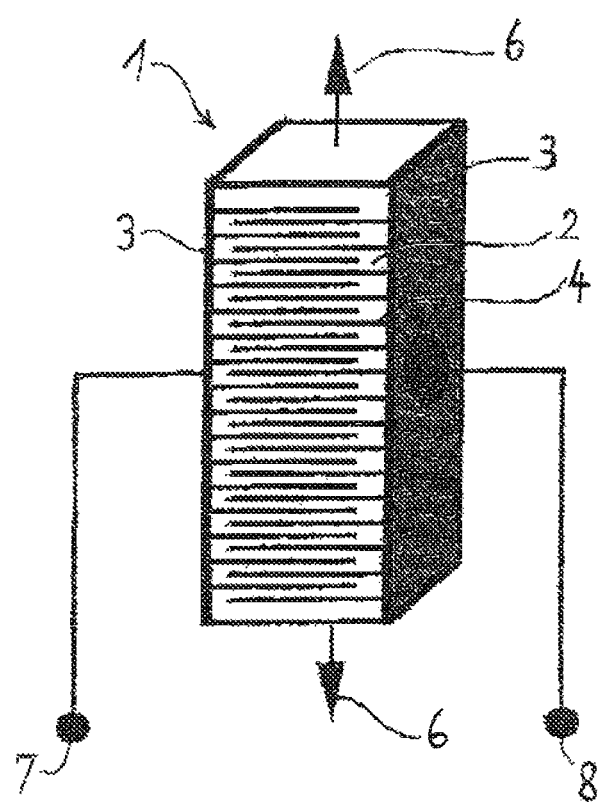

PIEZOCERAMIC MULTI-LAYER ELEMENT

RELATED APPLICATIONS

This application is a §371 application from PCT/EP2008/064123 filed Oct. 20, 2008, which claims priority from German Patent Application No. 10 2007 000 523.9 filed Oct. 18, 2007, each of which is herein incorporated by reference in its entirety.

FIELD OF THE INVENTION

The invention relates to a material for producing a piezoceramic multi-layer element, a method for producing the material, a method for producing the multi-layer element, and also an inner-electrode material for use in the multi-layer element.

SUMMARY OF THE INVENTION

A piezoceramic multi-layer element, as known from the prior art, is shown in the accompanying FIGURE. A multi-layer element 1 consists of stacked thin layers of piezoelectrically active material 2, for example lead zirconate titanate (PZT), with conductive inner electrodes 4 arranged in between that are directed alternately to the element surface. Outer electrodes 3 connect these inner electrodes 4. As a result, the inner electrodes 4 are electrically connected in parallel and combined to form two groups that represent the two terminal poles 7 and 8 of the multi-layer element 1. When an electric voltage is applied to the terminal poles 7 and 8, this is transmitted in parallel to all the inner electrodes 4 and gives rise to an electric field in all the layers of the active material, which is mechanically deformed as a result. The sum of all these mechanical deformations is available at the end faces of the element as a useful extension 6 and/or force.

In accordance with the prior art, piezoceramic multi-layer elements are sintered in air at temperatures of approximately 1100° C. or above. That is why only a noble metal with a high melting temperature can be used as the inner electrode. Non-noble metals would oxidize. A silver-palladium alloy with up to 40% by weight palladium is therefore normally used. However, this is associated with high material costs. Low melting temperatures of the inner-electrode material, though, also require a ceramic material that has correspondingly low sintering temperatures.

OBJECTS OF THE INVENTION

The underlying object of the invention is to eliminate the disadvantages of the prior art and to reduce the costs of piezoceramic multi-layer elements by means of a ceramic material with a lower sintering temperature than is usual and also inner electrodes without a proportion of noble metal or at least with a substantially lower proportion of noble metal.

The object is achieved with the aid of a material for producing a piezoceramic multi-layer element from a PZT material as a base material according to the present invention, a method for producing this material according to the present invention, a method for producing the multi-layer element according to the present invention, and an inner-electrode material according to the present invention for use in the piezoceramic multi-layer element.

Advantageous developments of the invention are described herein.

BRIEF DESCRIPTION OF THE FIGURE

FIG. 1 shows a piezoceramic multi-layer element as known from the prior art.

DETAILED DESCRIPTION

Silver is not graded as a noble metal in the description that follows, although, considered electrochemically, it does belong to the noble metals.

The multi-layer element in accordance with the invention contains inner electrodes, the main-material component of which consists of pure silver without any other proportion of noble metal. Since silver melts at 961° C. and this temperature drops even further in the presence of piezoceramic material, a sintering temperature of 950° C. should not be exceeded. This aim can be achieved by means of three measures:
a) A PZT ceramic material that sinters at low temperatures must be used;
b) The PZT material must be robust with respect to the inward diffusion of silver when sintering. The silver that diffuses in out of the inner electrode lowers the sintering temperature further considerably. However, it should affect the piezomechanical properties of the material as little as possible;
c) The inner electrode must be stabilized by additions of PZT or related types of ceramic material and/or a metal alloy and/or metal-oxide mixture, since otherwise it largely diffuses into the ceramic material, changes the properties thereof or loses its conductivity.

The ceramic material in accordance with the invention preferably consists of lead zirconate titanate, barium titanate or bismuth titanate. The reduction in the sintering temperature is achieved by adding to the base material PZT an electrically non-conductive sintering aid, the concentration of which in the sum of the substances amounts to ≤5% by weight, preferably <1% by weight, particularly preferably <0.5% by weight.

The following sintering aids are used in accordance with the invention:
Sintering aids are selected from monovalent, bivalent or trivalent metal oxides, such as $Na_2O$, $K_2O$, MgO, CaO, SrO, $Al_2O_3$, $Fe_2O_3$, NiO, $Mn_2O_3$ or $Cr_2O_3$.
Sintering aids are used that contain tetravalent cations, with $SiO_2$, $GeO_2$, $InO_2$, $TlO_2$ or $SnO_2$ preferably being used.
Sintering aids are used that contain pentavalent cations, with $P_2O_5$, $As_2O_5$, $Sb_2O_5$ or $Bi_2O_5$ preferably being used.
The sintering aid can consist of one substance or a combination of the afore-mentioned substances of a group or a combination of the afore-mentioned substances of the various groups.
The concentration of the sintering aid in the sum of the substances is ≤5% by weight, preferably <2% by weight and particularly preferably <1% by weight.
The concentration of an individual substance of a sintering aid is ≤3% by weight, preferably <1% by weight and particularly preferably <0.5% by weight.
The addition of the quantity of the sintering aid can already be taken into account in the recipe if it is effected during the mixing of the raw materials before calcination or after calcination.
The addition of the quantity of the sintering aid is effected by measuring and doping to a target value in order thus to take into account fluctuations in the raw materials and the method of preparation.

Coating with liquid addition of the sintering aid can also be effected before or after calcination.

By means of the PZT material in accordance with the invention it is possible to lower the sintering temperature to below 900° C. and to produce a multi-layer element that has the same properties as an element containing noble metal in accordance with the prior art.

In the case of a monolithic multi-layer element in accordance with the invention that can comprise, for example, 1 to 1000 courses of piezoelectrically active material, the material in accordance with the invention of the inner electrodes, which are located in the active material, consists of silver, preferably of pure silver, to which in addition an electrically non-conductive material can be added in a proportion by weight of 0% to a maximum of 30%, preferably less than 15%. The silver of the inner electrodes, in the starting state before sintering, is present as spherical particles (powder).

Lead titanate zirconate (PZT), consisting in particular of a co-doped material, can be added to the inner electrodes as an electrically non-conductive material in a proportion by weight of up to a maximum of 30%, preferably 5% to 15%.

In addition to the electrically non-conductive material it is also possible to add to the material of the inner electrodes a metal alloy and/or a metal-oxide mixture in a proportion of no more than 30% by weight, preferably less than 10, particularly preferably less than 5% by weight. The proportion of the two added substances can thus amount in total to 60% by weight, and the substances can be mixed together in any composition. This metal alloy and/or metal-oxide mixture can, however, also replace the proportion of the electrically non-conductive material. Noble metal, with the exception of silver, can be used as the metal alloy and/or metal-oxide mixture. The metal alloy and/or metal-oxide mixture can contain palladium or platinum. In order to produce a multi-layer element in accordance with the invention, use is made of a calcined PZT material, for example in accordance with the composition $0.98Pb(Zr_{0.53}Ti_{0.47})O_3$–$0.02Sr(K_{0.25}Nb_{0.75})O_3$, as known from DE 19 840 488 A1.

The production of a multi-layer element in accordance with the invention is explained in greater detail with reference to a method that is generally possible. The film technique is applied in order to produce multi-layer elements. The procedure described and the parameters described only give an example. Similar procedures and parameters are obvious at any time to the person skilled in the art.

The calcined starting material is pre-comminuted and ground in an annular-gap ball mill to an average grain size of, for example, 0.8 μm.

A castable slip is prepared in accordance with the prior art from the resultant powder, with one or more of the substances mentioned above being added thereby in a defined manner as the sintering aid. The castable slip is cast to form a continuous film, dried and rolled up. Casting bands that operate according to the doctor-blade method are suitable for this, for example. According to this method, after drying the film has a thickness of, for example, 70 μm and after sintering a thickness of 60 μm.

The film is divided into sections of approximately 200× 200 mm. Thereupon, the inner-electrode patterns of metal paste are printed on by means of screen-printing. The subsequent dimension of the multi-layer element is defined by the form of the print layout.

The inner-electrode paste can be produced from pure silver powder or, for example, from a mixture of silver powder with a PZT powder of the composition predetermined above in terms of the formula. In addition, a metal alloy or a metal-oxide mixture of the kind specified above can be added. This metal alloy or metal-oxide mixture can, however, also replace the proportion of the electrically non-conductive material. Binders, such as ethyl cellulose, and solvents, such as terpineol, ensure that there is good printability of the paste. The paste is printed on in such a way that the thickness of the inner electrode after sintering amounts to approximately 3 μm.

The film sections that have been printed on and dried are stacked in such a way that the structure of the multi-layer element develops.

The stacked films are now compressed in accordance with the prior art at an elevated pressure and an elevated temperature to form a laminate.

Subsequently, the laminate is separated into the forms that are predetermined by the print layout and the number of the multi-layer elements, for example by sawing or punching.

The multi-layer elements are freed of the organic binder portions at a temperature of 500° C. and subsequently sintered at 900° C.

The sintered multi-layer elements are ground at the narrow edges and printed on with a basic metallization for the connection of the outer electrodes.

As a result of applying a voltage of 200 V, the multi-layer elements are now polarized in such a way that a polarization that is continuous in one direction develops.

For a first exemplary embodiment multi-layer elements having the dimensions 7×7×30 mm are produced in accordance with the method described above with the addition of phosphorus pentoxide and iron oxide as sintering aids. The addition is performed in such a way that the content, according to analysis of the unsintered ceramic film, amounts to 200 ppm phosphorus and 0.4% iron relative to the weight of the solid ceramic matter. A mixture of pure silver powder, 90% by weight, and finely ground PZT powder, 10% by weight, is used as the inner-electrode material. The mixture is stirred with ethyl cellulose and terpineol to form a paste containing 50% of the mixture.

The multi-layer elements are sintered at 900° C. The thickness of the ceramic films, after sintering, amounts to 90 μm. When a 200 V operating voltage is applied, the component has a specific extension of 1.4 parts per thousand of the total length and a blocking tension of 40 N/mm².

For a second exemplary embodiment, multi-layer elements having the dimensions 7×7×30 mm are produced in accordance with the method described above with the addition of phosphorus pentoxide and iron oxide as sintering aids. The addition is performed in such a way that the content, according to analysis of the unsintered ceramic film, amounts to 200 ppm phosphorus and 0.4% iron relative to the weight of the solid ceramic matter.

A mixture of pure silver powder, 80% by weight, and finely ground PZT powder, 20% by weight, is used as the inner-electrode material. The mixture is stirred with ethyl cellulose and terpineol to form a paste containing 50% of the mixture.

The multi-layer elements are sintered at temperatures around 900° C. The thickness of the ceramic films, after sintering, amounts to 60 μm.

When a 200 V operating voltage is applied, the component has a specific extension of 2.0 parts per thousand of the total length and a blocking tension of 56 N/mm².

For the purposes of comparison, multi-layer elements having the dimensions 7×7×30 mm are produced in accordance with the method described above, but in the composition known from the prior art, that is, without the addition of sintering aids. A commercially available metal paste with the composition AgPd 70/30 is used in the metal portion as the inner-electrode material.

The multi-layer elements are sintered at temperatures around 1000° C. The thickness of the ceramic films, after sintering, amounts to 90 μm.

When a 200 V operating voltage is applied, the component has a specific extension of 1.7 parts per thousand of the total length and a blocking tension of 40 N/mm².

When the two exemplary embodiments are compared with the prior art it becomes apparent that the specific extension of the multi-layer elements amounts to approximately 80% of the extension of standard multi-layer elements provided with AgPd 70/30 inner electrodes. At the same time, however, the multi-layer elements in accordance with the invention, as a result of the effect of the sintering aids, are more rigid and dense, something which can be seen from the unchanged value for the mechanical blocking tension and a considerably higher electrical breakdown voltage.

It is therefore possible to reduce the layer thickness in the case of the multi-layer elements and, as a result, given the same operating voltage increase the operating field strength in the active material and produce equivalent or even superior multi-layer elements.

It is claimed:

1. A method for producing a material for producing a piezoceramic multi-layer element from a piezoelectric ceramic material as a base material that sinters at temperatures below 950° C., wherein an electrically non-conductive sintering aid is added to the base material, wherein the electrically non-conductive sintering aid comprises at least one member selected from the group consisting of $Na_2O$, $K_2O$, $P_2O_5$, $As_2O_5$, $GeO_2$ and $InO_2$;
or
wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

2. The method according to claim 1, wherein the base material is selected from the group consisting of lead zirconate titanate, barium titanate and bismuth titanate.

3. The method according to claim 1, wherein the sintering aid is present in an amount of <5% by weight.

4. The method according to claim 1, wherein ≤3% by weight is chosen as the concentration of an individual substance of the sintering aid.

5. The method according to claim 1, wherein the addition of the quantity of the sintering aid is already taken into account in the recipe if it is effected during the adding of the raw materials.

6. The method according to claim 1, wherein the addition of the quantity of the sintering aid is effected by measuring and doping to a target value in order to take into account fluctuations in the raw materials and the method of preparation.

7. The method according to claim 1, wherein a coating is performed with a liquid containing the sintering aid.

8. The method according to claim 4, wherein the addition of the quantity of the sintering aid is already taken into account in the recipe if it is effected during the adding of the raw materials before calcination or after calcination.

9. A method for producing a piezoceramic multi-layer element from a piezoelectric ceramic material as a base material, comprising the steps of:
adding an electrically non-conductive sintering aid to the base material;
grinding a calcined piezoelectric ceramic material as the base material to form a powder;
preparing from the powder a castable slip to which the electrically non-conductive sintering aid in a quantity of <5% by weight;
casting the castable slip to form a continuous film;
drying and dividing the continuous film into film sections;
printing on said film sections with a metal paste of inner electrodes, the metal paste comprises a main-material component of which consists of pure silver without any other proportion of noble metal in the form of a print layout thereof;
stacking a plurality of the printed film sections to form the multi-layer element;
compressing the stacked films at an elevated pressure and an elevated temperature of 900° C. or below to form a laminate;
separating the laminate into forms that are predetermined by the print layout and a number of the multi-layer elements;
freeing the multi-layer elements of any organic binder portions at a temperature of approximately 500° C.; and
subsequently sintering at a temperature below 1000° C. to form the piezoceramic multi-layer element,
wherein the electrically non-conductive sintering aid comprises at least one member selected from the group consisting of $N_2O$, $K_2O$, $P_2O_5$, $As_2O_5$, $GeO_2$ and $InO_2$;
or
wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

10. A method for producing a piezoceramic multi-layer element from a material for producing a piezoceramic multi-layer element from a piezoelectric ceramic material as a base material, comprising the steps of:
adding an electrically non-conductive sintering aid to the base material;
grinding a calcined piezoelectric ceramic material as the base material to form a powder;
preparing from the powder a castable slip to which the electrically non-conductive sintering aid in a quantity of <5% by weight;
casting the castable slip to form a continuous film;
drying and dividing the continuous film into film sections;
printing on said film sections with a metal paste of inner electrodes, the metal past comprising a main-material component comprising pure silver without any other proportion of noble metal in the form of a print layout thereof;
stacking a plurality of the printed film sections to form the multi-layer element; and
compressing the stacked films at an elevated pressure and an elevated temperature of 900° C. or below to form a laminate,
wherein the electrically non-conductive sintering aid comprises at least one member selected from the group consisting of $Na_2O$, $K_2O$, $P_2O_5$, $As_2O_5$, $GeO_2$ and $InO_2$;
or wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

11. The method according to claim 1, wherein the electrically non-conductive sintering aid comprises at least one member selected from the group consisting of $Na_2O$, $K_2O$, $P_2O_5$, $As_2O_5$, $GeO_2$ and $InO_2$.

12. The method according to claim 1, wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

13. The method according to claim 9, wherein the electrically non-conductive sintering aid comprises at least one member selected from the group consisting of $Na_2O$, $K_2O$, $P_2O_5$, $As_2O_5$, $GeO_2$ and $InO_2$.

14. The method according to claim 9, wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

15. The method according to claim 10, wherein the electrically non-conductive sintering aid comprises at least one member selected from the group consisting of $Na_2O$, $K_2O$, $P_2O_5$, $As_2O_5$, $GeO_2$ and $InO_2$.

16. The method according to claim 10, wherein the electrically non-conductive sintering aid comprises at least one trivalent oxide selected from the group consisting of $Al_2O_3$, $Fe_2O_3$, $Mn_2O_3$ and $Cr_2O_3$; and at least one pentavalent oxide selected from the group consisting of $P_2O_5$, $As_2O_5$, $Sb_2O_5$ and $Bi_2O_5$.

* * * * *